（12）United States Patent
Lin et al.

(10) Patent No.: US 10,312,146 B2
(45) Date of Patent: Jun. 4, 2019

(54) METHOD FOR FABRICATING SEMICONDUCTOR DEVICE

(71) Applicant: United Microelectronics Corp., Hsinchu (TW)

(72) Inventors: Ching-Ling Lin, Kaohsiung (TW); Wen-An Liang, Tainan (TW); Chen-Ming Huang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/647,031

(22) Filed: Jul. 11, 2017

(65) Prior Publication Data

US 2019/0019731 A1    Jan. 17, 2019

(51) Int. Cl.
*H01L 21/8234* (2006.01)
*H01L 21/033* (2006.01)
*H01L 21/8238* (2006.01)
*H01L 21/84* (2006.01)
*H01L 21/324* (2006.01)
*H01L 21/02* (2006.01)
(Continued)

(52) U.S. Cl.
CPC ........ *H01L 21/823431* (2013.01); *H01L 21/02296* (2013.01); *H01L 21/0332* (2013.01); *H01L 21/0337* (2013.01); *H01L 21/324* (2013.01); *H01L 21/823481* (2013.01); *H01L 21/823821* (2013.01); *H01L 21/845* (2013.01); *H01L 27/0886* (2013.01); *H01L 29/41791* (2013.01)

(58) Field of Classification Search
CPC ..... H01L 21/823431; H01L 21/823468; H01L 21/823821; H01L 21/845; H01L 21/30; H01L 21/308; H01L 21/3081; H01L 21/3083; H01L 21/3085; H01L 21/3086; H01L 21/0475; H01L 27/0886; H01L 27/0924; H01L 27/10826; H01L 27/10879; H01L 27/1211; H01L 29/41791; H01L 29/66795
See application file for complete search history.

(56) References Cited

U.S. PATENT DOCUMENTS 9,673,330 B2 * 6/2017 Chung ................ H01L 29/0649
9,748,245 B1 * 8/2017 Cheng ................ H01L 29/0653
(Continued)

OTHER PUBLICATIONS

Kuan Hsien Li et al., "Method for Forming Fin Structures for Non-Planar Semiconductor Device", Unpublished U.S. Appl. No. 15/067,157, filed Mar. 10, 2016.

*Primary Examiner* — Eduardo A Rodela
(74) *Attorney, Agent, or Firm* — J.C. Patents

(57) ABSTRACT

A method for fabricating a semiconductor structure includes forming a plurality of mandrels over a substrate, wherein the substrate comprises a semiconductor substrate as a base. Then, a first dielectric layer is formed to cover on a predetermined mandrel of the mandrels. A second dielectric layer is formed over the substrate to cover the mandrels. The mandrels are removed, wherein a remaining portion of the first dielectric layer and the second dielectric layer at a sidewall of the mandrels remains on the substrate. An anisotropic etching process is performed over the substrate until a top portion of the semiconductor substrate is etched to form a plurality of fins corresponding to the remaining portion of the first dielectric layer and the second dielectric layer.

18 Claims, 7 Drawing Sheets

(51) Int. Cl.
*H01L 27/088* (2006.01)
*H01L 29/417* (2006.01)

(56) References Cited

U.S. PATENT DOCUMENTS

| | | | |
|---|---|---|---|
| 9,853,159 B2* | 12/2017 | Basker | H01L 29/785 |
| 2014/0329388 A1 | 11/2014 | Jang et al. | |
| 2015/0249153 A1* | 9/2015 | Morin | H01L 29/785 |
| | | | 257/192 |
| 2016/0351681 A1* | 12/2016 | Akarvardar | H01L 29/6681 |
| 2016/0365425 A1* | 12/2016 | Chen | H01L 29/6653 |
| 2017/0140997 A1* | 5/2017 | Pae | H01L 21/3081 |
| 2017/0263454 A1* | 9/2017 | Li | H01L 21/0337 |
| 2018/0040703 A1* | 2/2018 | Chang | H01L 29/41791 |

\* cited by examiner

METHOD FOR FABRICATING SEMICONDUCTOR DEVICE

BACKGROUND

1. Field of the Invention

The present invention generally relates to semiconductor fabrication, and particularly to a method for fabrication a semiconductor device.

2. Description of Related Art

As the request to reduce the size of electronic device and increase the operation speed of electronic device, the size of the semiconductor device such as field effect transistor (FET) needs to be accordingly reduced. When size of the FET is greatly reduced, the conventional FET with polysilicon gate cannot be adapted well. So, the structure of FET in 2D structure is no longer suitable for use.

In the technologies under development, a type of fin FET has been proposed. The fin FET is in 3D structure, in which the source/drain region has been raised up from the substrate, like a fin in structure. The gate can be formed as a gate line, crossing over the fin to serve as the gate structure for each FET and also the connection part between the related FET.

The fins for the Fin FETs are formed on the top portion of a semiconductor substrate, such as the silicon substrate. In the beginning the fins are evenly formed on the substrate with equal condition, such as same width of fin. However, depending on the circuit design, the device density or device loading at some area is lower than the other area, becoming rather isolated fin(s). When an oxide layer is forming over the fins, including the isolated fin, by flowable chemical vapor deposition (FCVD) with annealing, the isolated fin in silicon material would be oxidized at the surface more than the usual fins with higher device loading.

As a result, the fin width for the rather isolated fin would be smaller at the end. This phenomenon would affect the performance of the isolated fin FET. This issue in reducing the fin width in fabrication needs to be really concerned.

SUMMARY OF THE INVENTION

The invention provides a fabrication method, in which the width for the rather isolated fin is not significantly reduced after the procedure of FCVD process.

In an embodiment, the invention provides a method for fabricating a semiconductor device. The method includes forming a plurality of mandrels over a substrate, wherein the substrate comprises a semiconductor substrate as a base. Then, a first dielectric layer is formed to cover on a predetermined mandrel of the mandrels. A second dielectric layer is formed over the substrate to cover the mandrels. The mandrels are removed, wherein a remaining portion of the first dielectric layer and the second dielectric layer at a sidewall of the mandrels remains on the substrate. An anisotropic etching process is performed over the substrate until a top portion of the semiconductor substrate is etched to form a plurality of fins corresponding to the remaining portion of the first dielectric layer and the second dielectric layer.

In an embodiment, as to the method, it further comprises removing a dummy fin of the fins, wherein at least one fin of the fins having the first dielectric layer remains, depositing oxide over the substrate to form an oxide layer covering the fins, and perform annealing over the substrate.

In an embodiment, as to the method, it further comprises removing a top portion of the oxide layer to expose the fins.

In an embodiment, as to the method, the step of forming the first dielectric layer comprises forming a global dielectric layer over the substrate, forming a mask layer over the substrate to cover a predetermined sidewall of the predetermined mandrel, removing the global dielectric layer using the mask layer as an etching mask, and removing the mask layer.

In an embodiment, as to the method, the mask layer covers both the sidewall of the predetermined mandrels or just one sidewall of the predetermined mandrels.

In an embodiment, as to the method, the substrate further comprises a stack dielectric layer on the semiconductor substrate.

In an embodiment, as to the method, a thickness of the first dielectric layer is less than a thickness of the second dielectric layer.

In an embodiment, as to the method, a thickness of the first dielectric layer is in a range of 1-5 nm.

In an embodiment, as to the method, a thickness of the first dielectric layer is in a range of 1-2 nm.

In an embodiment, as to the method, a width of the fins is in a range of 15-20 nm.

In an embodiment, as to the method, a thickness of the first dielectric layer is used to compensate a semiconductor consumption on a sidewall surface of the fin corresponding to the predetermined mandrel.

In an embodiment, as to the method, a ratio of a thickness of the first dielectric layer to a width of the fins is in a range of 10 to 20.

In an embodiment, as to the method, the step of removing the mandrels comprises performing an etching back process on the first dielectric layer and the second dielectric layer to form a dielectric spacer on a sidewall of the mandrels, wherein the dielectric spacer of the predetermined mandrels comprises the first dielectric layer, and removing the mandrels.

In an embodiment, as to the method, a material of the mandrel is a material, so to be distinct over dielectric material of the first dielectric layer and the second dielectric layer in etching.

In an embodiment, as to the method, a material of the mandrels is polysilicon.

In an embodiment, as to the method, the first dielectric layer and the second dielectric layer are silicon nitride.

In an embodiment, as to the method, it further comprises removing a dummy portion of the fins, wherein at least one fin of the fins having the first dielectric layer remains.

In an embodiment, as to the method, the dummy portion of the fins also comprises a fin having the first dielectric layer but not to be used.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to fabricating a semiconductor device such as fin FET, in which the fin is formed on a semiconductor substrate. In other words, the invention includes patterning a substrate to form fins. In application of Fin FET as an example, the fin is used to form the source electrode and the drain electrode.

The invention has looked into the fabrication procedure and addressed the issue to be at least concerned in the invention. Usually, a large number of fins to be formed on the top portion of the silicon substrate. However, the fin loading (fin density) are not all the same. In a case, one fin or few fins would be distant away from the main area and become a certain level of isolation with less fin loading.

In fabrication, after the fins are formed, an oxide layer is deposited over the substrate to cover the fins and then an annealing process is performed. The annealing process would also cause the surface portion of the fins is consumed due to oxidation.

As looking into the issues by the invention, the rather isolated fin has a larger surface portion being consumed in the annealing process. As a result, the fin width gets reduced.

The invention has proposed to additionally form nitride layer over the mandrel, which is corresponding to the rather isolated fin(s). As result, the fin width is larger before annealing process after depositing the oxide. Then, although the rather isolated fin has larger silicon consumption during the annealing process, the larger width can compensate this silicon consumption. As a result, the fin width for the rather isolated fin can be near to the other fins at the normal loading area.

Several embodiments are provided to describe the invention, but not for limiting the invention.

FIG. 1A to FIG. 1M are a drawing, schematically illustrating a method for fabricating a semiconductor device by showing cross-sectional views as fabricated, according to an embodiment of the invention.

Figure 1A:
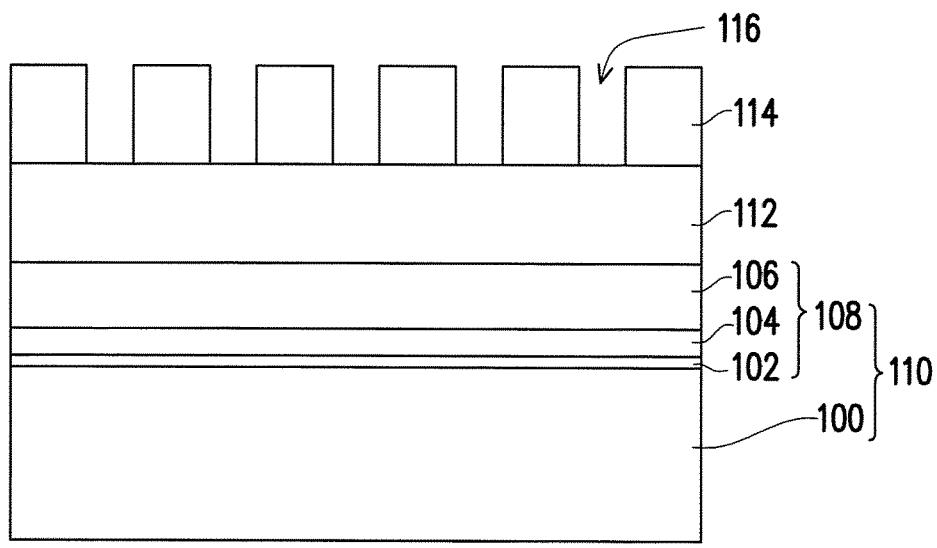
FIG. 1A to FIG. 1M are a drawing, schematically illustrating a method for fabricating a semiconductor device by showing cross-sectional views as fabricated, according to an embodiment of the invention.

In FIG. 1A, a substrate 110 including the semiconductor substrate 100 as a base is provided. Due to the fabrication procedures having performed at the portion of the substrate, a stack dielectric layer 108 is usually formed on the semiconductor substrate 100. The stack dielectric layer 108 in an example can include a pad oxide layer 102, a pas silicon nitride layer 104 and an oxide layer 106, but not limited thereto. A preliminary mandrel layer 112, such as polysilicon layer, for forming mandrels later is formed over the substrate 110. A photoresist layer 114 is formed on the preliminary mandrel layer 112. The photoresist layer 114 has a pattern of which the openings or trenches 116 are formed to expose the preliminary mandrel layer 112, where are to be formed for mandrels later.

Figure 1B:
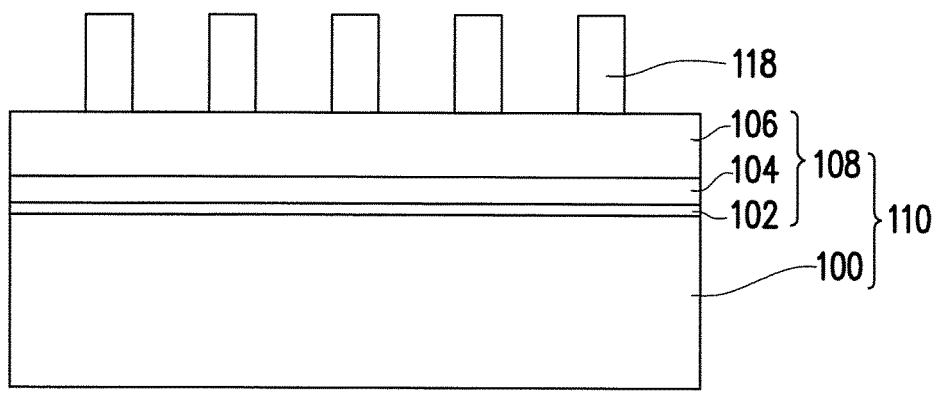

In FIG. 1B, using the photoresist layer 114 as an etching mask, an anisotropic etching process is performed to etch the preliminary mandrel layer 112 from the openings 116, so as to form the mandrels 118 over the substrate 110. Then, the photoresist layer 114 is removed.

Figure 1C:
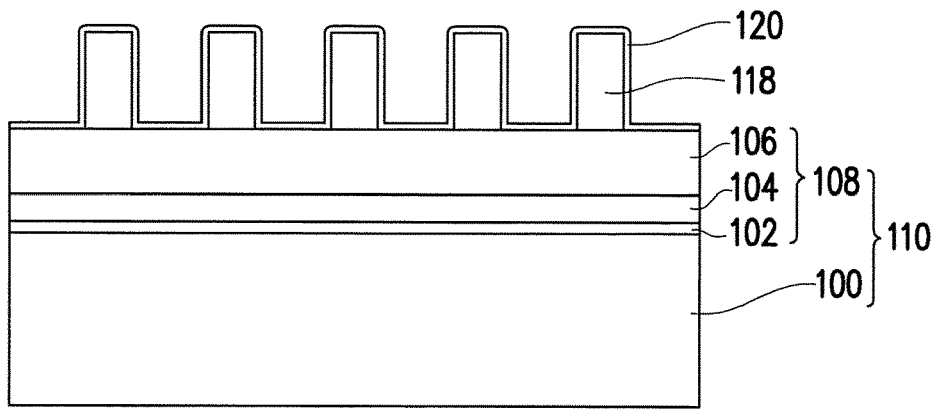

In FIG. 1C, a first dielectric layer 120 is conformally forming over the substrate 110 to cover the mandrels 118. In an example, the thickness of the first dielectric layer 120 is in a range of 1 nm to 5 nm or 1 nm to 2 nm. The thickness of the first dielectric layer 120 in general is used to increase the fin width as formed later, so that the first dielectric layer 120 can compensate the consumption of the fins due to oxidation during annealing in FCVD. The first dielectric layer 120 can be nitride or oxide formed by any suitable deposition method such as atomic layer deposition (ALD), which can be etched away later. A ratio of a thickness of the first dielectric layer 120 to a width of the fins is in a range of 10 to 20.

Figure 1D:
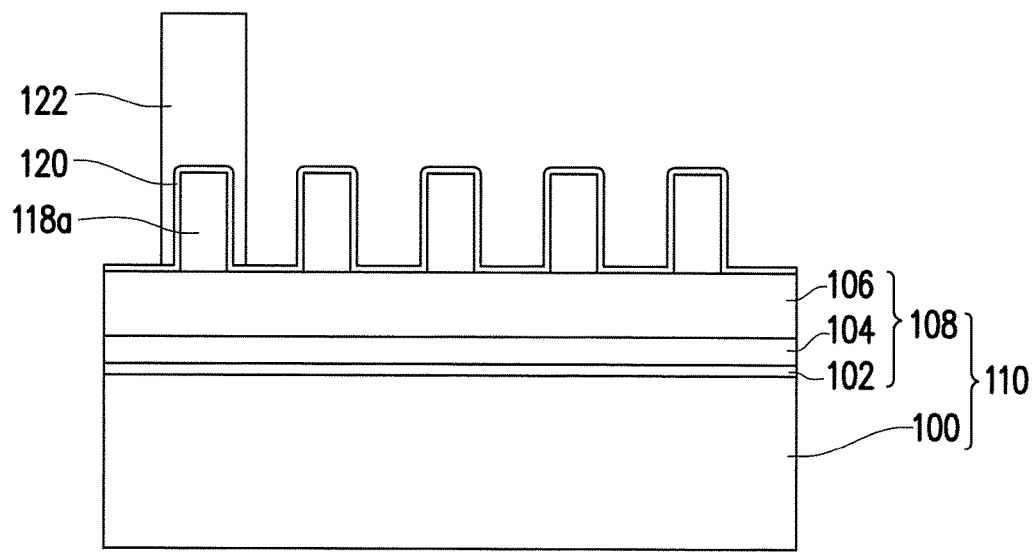

In FIG. 1D, a photoresist layer 122 is also over the substrate 110 to cover a selected mandrel 118a of the mandrels 118, corresponding to the rather isolated fin as to be seen later. Here, the number of the selected mandrel 118a can be one or more than one.

Figure 1E:
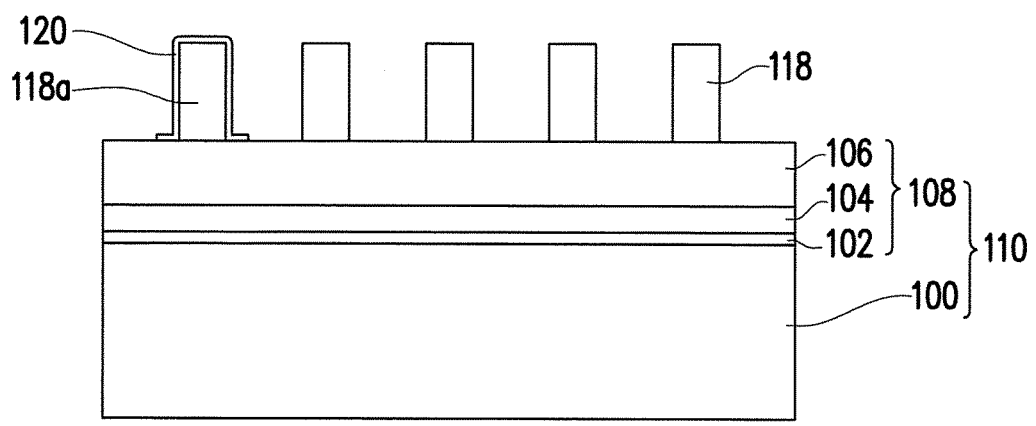

In FIG. 1E, using the photoresist layer 122 as an etching mask, the other portion of the first dielectric layer 120 not covered by the photoresist layer 122 is etched away. After removing the photoresist layer 122, the selected mandrel 118a covered by the first dielectric layer 120 is obtained. The mandrel 118a at the predetermined location is used to form the isolated fin later.

Figure 1F:
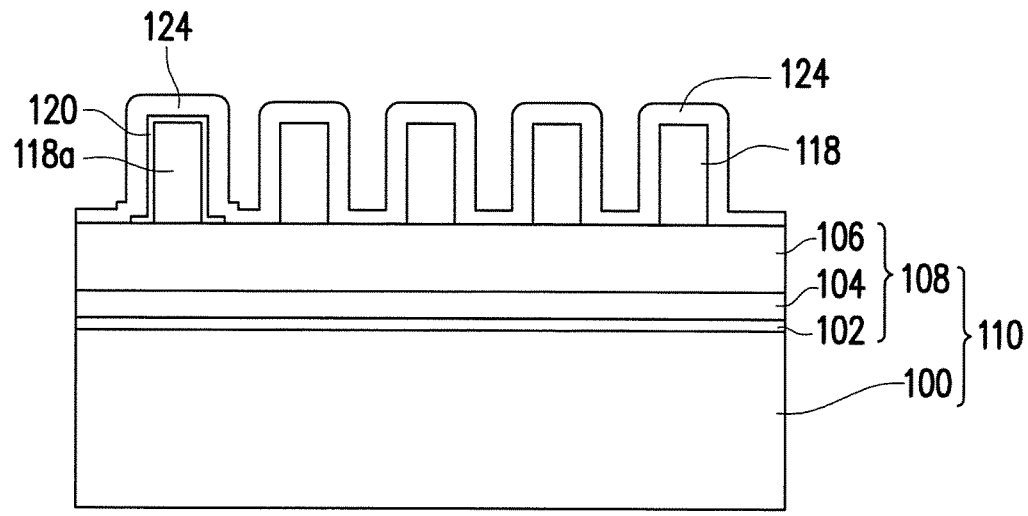

In FIG. 1F, a second dielectric layer 124 is forming over the substrate 110 to cover the mandrels 118a, 118. The thickness of the second dielectric layer 124 is thick and is corresponding to the fin width as expected. In other word, the thickness of the second dielectric layer 124 determines the fin width to be formed as expected in design. The fin width as an example is in a range of 15 nm to 20 nm.

Figure 1G:
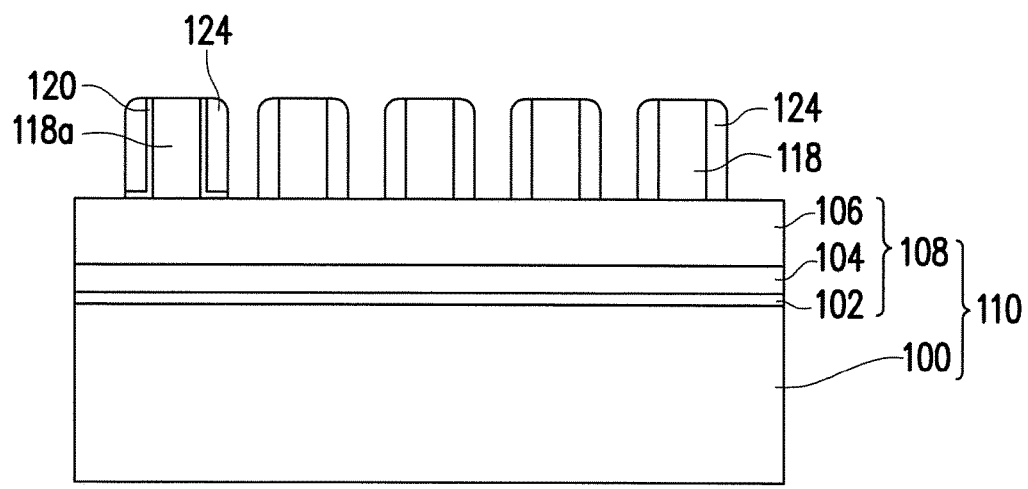

In FIG. 1G, an anisotropic etching process is performed over the substrate 110 to etch the second dielectric layer 124 and then the first dielectric layer 120. As to the usual mandrels 118 without the first dielectric layer 120, the remaining portion of the second dielectric layer 124 forms the spacers. As to the selected mandrel 118a with the first dielectric layer 120, the remaining portion of the first dielectric layer 120 and the second dielectric layer 124 forms the spacers of the mandrels 118a.

As noted here, the spacer for the mandrel 118a is wider than the spacer of the usual mandrels 118.

Figure 1H:
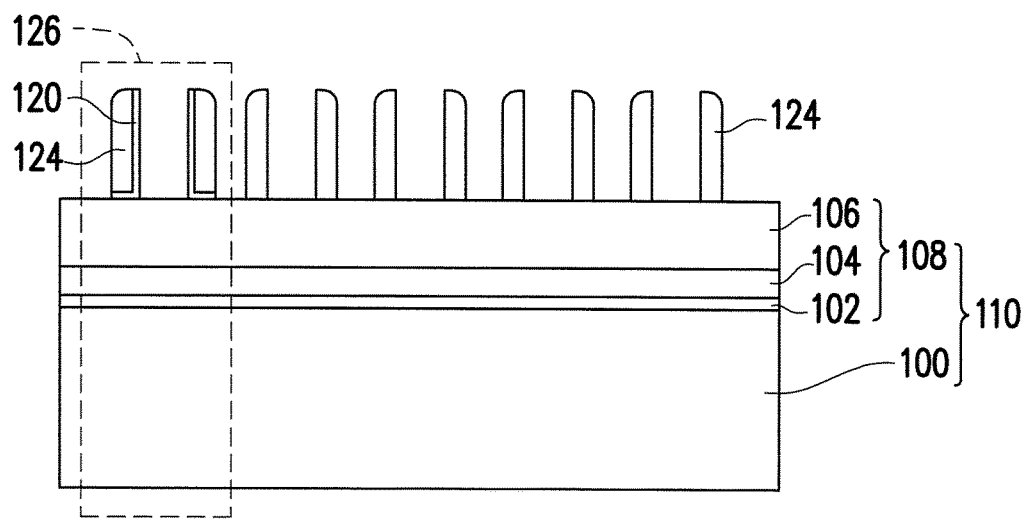

In FIG. 1H, the mandrels 118, 118a are removed away. As a result, the spacers remain on the stack dielectric layer 108 of the substrate 110. The remaining portion of the first dielectric layer 120 and the second dielectric layer 124 as the spacers at the region 126 are corresponding to the isolated fin. Then, an anisotropic etching process is performed over the substrate to etch into the semiconductor layer 110, in which the dielectric material and the semiconductor material, such as Si, of the semiconductor substrate 100 are etched.

Figure 1I:
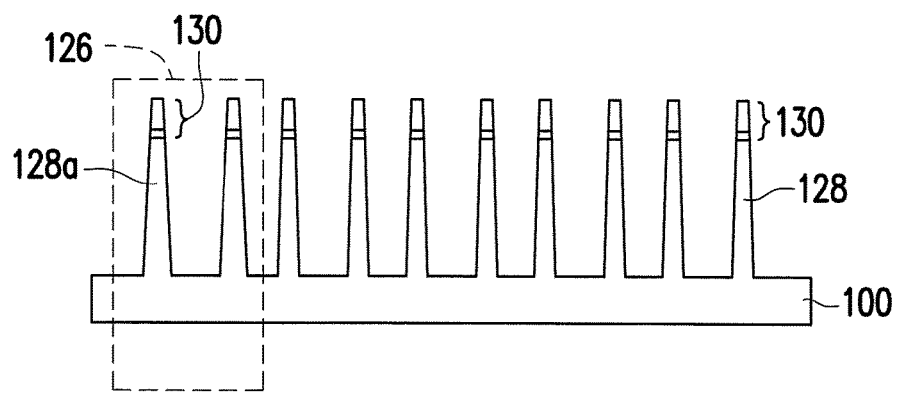

In FIG. 1I, during the etching process, the remaining portion of the second dielectric layer 124 and the first dielectric layer 120 contributes the additional thickness for etching. The etching process keeps on until a top portion of the semiconductor substrate 100 is etched. Due to addition thickness from the spacers from the remaining portion of the second dielectric layer 124 and the first dielectric layer 120, the semiconductor substrate 100 under the remaining portion of the second dielectric layer 124 and the first dielectric layer 120 is not etched, which becomes the fins 128a. In other words, a remaining dielectric 130 still covers the semiconductor substrate 100, so that the semiconductor substrate 100 under the remaining dielectric 130 is not etched, which becomes the fins 128, 128a.

As to be noted, fin width of the fins 128a within the region 126 is larger than fin width of the usual fins 128. This is because the first dielectric layer 120 add the fin width.

Figure 1J:
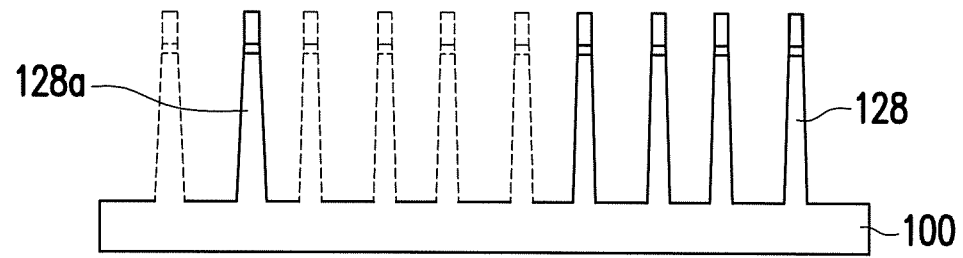
Figure 1K:
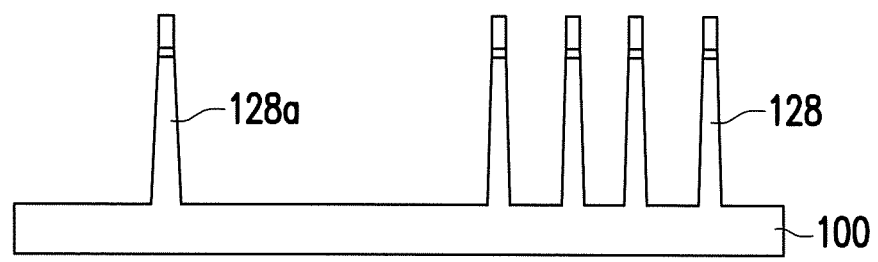

In FIG. 1J, according to the circuit layout, the isolated fin 128a is formed by removing some dummy fins as indicated by dashed lines, so as to be distant from the usual fins. In FIG. 1K, after actually removing the dummy fins, the isolated fin 128a has less device density than the usual fins 128. Here, the number of the isolated fin 128a is not limited to one as presented. It can be multiple as the actual need in layout. The example is just to indicate that some fin(s) are rather isolated from the main area and has less device density.

Figure 1L:
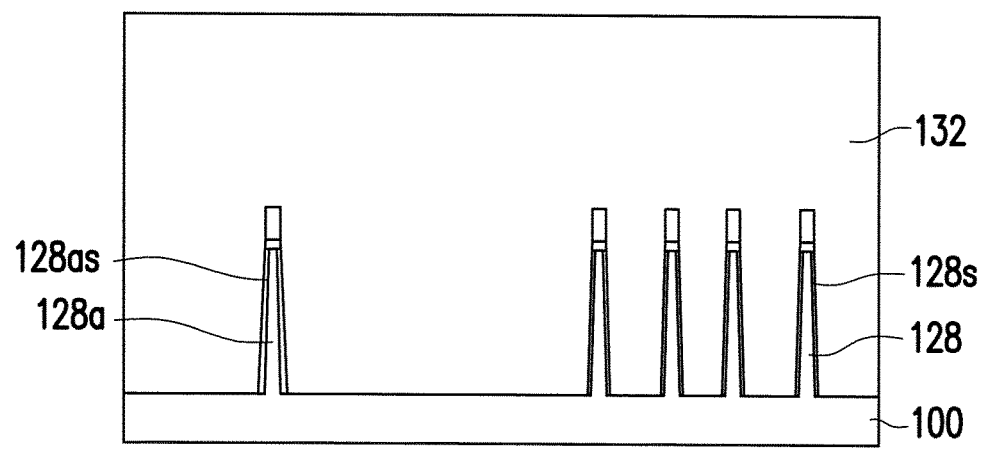

In FIG. 1L, an oxide layer 132 by FCVD process is formed over the substrate 100 to cover the fins 128, 128a. In order to have better quality of the oxide layer 132, an annealing process is performed to solidify the oxide layer 132. However, the annealing process would cause the oxidation on the surface of the fins 128, 128a.

Remarkably, the issue as investigated by the invention is observed that the oxidation for the isolated fin 128a is more to form the oxidation layer 128 as at the surface due to the isolation space. The usual fins 128 with larger device density has thinner oxidation layer 128s at the fin surface. However, the fin width of the isolated fin 128a is larger the fin width of the usual fins 128 due to the first dielectric layer 120 as shown in FIG. 1H. Due to the compensation of fin width, the fin 128a and the fin 128 has about the same fin width. If there is no the first dielectric layer 120, the isolated fin 128a would be thinner than the usual fin 128. The invention has effectively reduced this issue.

Figure 1M:
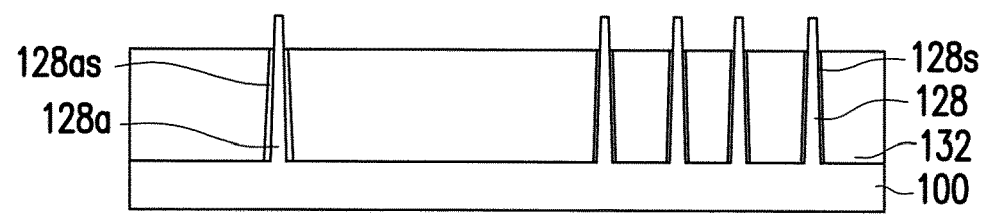

In FIG. 1M, a top portion of the oxide layer 132 is removed to expose the fins 128a, 128, which can be further processed to form the channel region, the source region and the drain region for the fin FET. The subsequent fabrication processes are omitted here.

The invention has used the first dielectric layer 120 to add the fin width of the isolated fins 128a, so as to compensate the oxidation consumption of silicon of the silicon fin 128a.

Figure 2A:
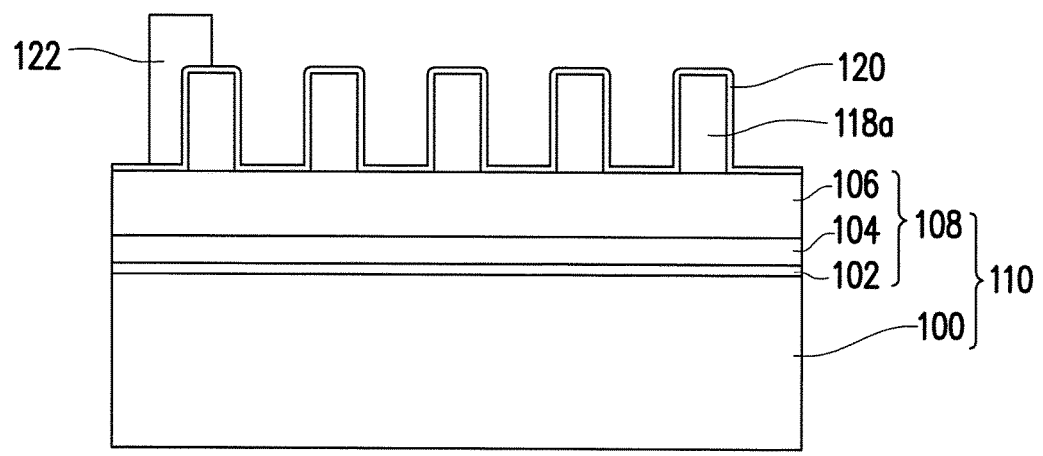
FIG. 2A to FIG. 2B are a drawing, schematically illustrating al alternative method for fabricating a semiconductor device to modify FIG. 1D and FIG. 1E, according to an embodiment of the invention.
Figure 2B:
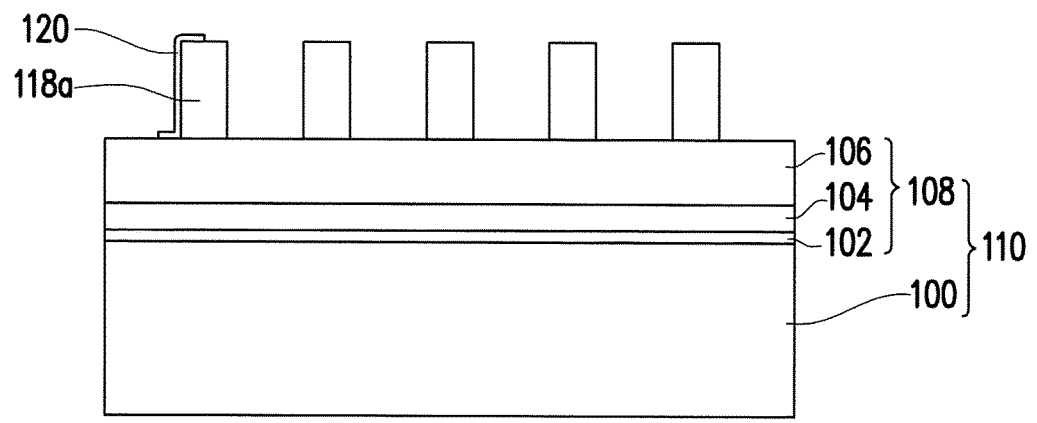

Further, as to formation of the isolated fin, some modification can be done. FIG. 2A to FIG. 2B are a drawing, schematically illustrating al alternative method for fabricating a semiconductor device to modify FIG. 1D and FIG. 1E, according to an embodiment of the invention.

In FIG. 2A, the process in FIG. 1E can be modified to form the photoresist layer 122 to just cover one sidewall of the mandrel 118a as expected. In FIG. 2B, after etching the first dielectric layer 120 by using the photoresist layer 122 as the etching mask, only one sidewall remains. However, the process in FIG. 1J would actually determine the isolated fin 118a. The structure of the result would be the same.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a semiconductor structure, comprising:
    forming a plurality of mandrels over a substrate, wherein the substrate comprises a semiconductor substrate as a base;
    forming a first dielectric layer to cover on a predetermined mandrel of the mandrels;
    forming a second dielectric layer over the substrate to cover the mandrels;
    removing the mandrels, wherein a remaining portion of the first dielectric layer and the second dielectric layer at a sidewall of the mandrels remains on the substrate;
    performing an anisotropic etching process over the substrate until a top portion of the semiconductor substrate is etched to form a plurality of fins corresponding to the remaining portion of the first dielectric layer and the second dielectric layer, wherein the fins comprises first fins corresponding to the first dielectric layer with the second dielectric layer and second fins corresponding to the second dielectric layer without the first dielectric layer, and the first fins are thicker than the second fins;
    removing a dummy fin of the fins, wherein at least one fin of the first fins subjecting to the first dielectric layer at an area adapting for a separately isolated device remains;
    depositing oxide over the substrate to form an oxide layer covering the fins as remained; and
    performing an annealing process over the substrate, wherein the at least one fin of the first fins has more surface oxidation thickness due to the annealing process than the second fins.

2. The method of claim 1, further comprising removing a top portion of the oxide layer to expose the fins.

3. The method of claim 1, the step of forming the first dielectric layer comprises:
    forming a global dielectric layer over the substrate;
    forming a mask layer over the substrate to cover a predetermined sidewall of the predetermined mandrel;
    removing the global dielectric layer using the mask layer as an etching mask; and
    removing the mask layer.

4. The method of claim 3, wherein the mask layer covers both the sidewall of the predetermined mandrels or just one sidewall of the predetermined mandrels.

5. The method of claim 1, wherein the substrate further comprises a stack dielectric layer on the semiconductor substrate.

6. The method of claim 1, wherein a thickness of the first dielectric layer is less than a thickness of the second dielectric layer.

7. The method of claim 1, wherein a thickness of the first dielectric layer is in a range of 1-5 nm.

8. The method of claim 7, wherein a thickness of the first dielectric layer is in a range of 1-2 nm.

9. The method of claim 7, wherein a width of the fins is in a range of 15-20 nm.

10. The method of claim 1, wherein a thickness of the first dielectric layer is used to compensate a semiconductor consumption on a sidewall surface of the fin corresponding to the predetermined mandrel.

11. The method of claim 1, wherein a ratio of a thickness of the first dielectric layer to a width of the fins is in a range of 10 to 20.

12. The method of claim 1, wherein the step of removing the mandrels comprises:
    performing an etching back process on the first dielectric layer and the second dielectric layer to form a dielectric spacer on a sidewall of the mandrels, wherein the dielectric spacer of the predetermined mandrels comprises the first dielectric layer; and
    removing the mandrels.

13. The method of claim 12, wherein a material of the mandrel is a material, so to be distinct over dielectric material of the first dielectric layer and the second dielectric layer in etching.

14. The method of claim 13, wherein a material of the mandrels is polysilicon.

15. The method of claim 13, wherein the first dielectric layer and the second dielectric layer are silicon nitride.

16. The method of claim 1, wherein the dummy fin as removed is abut to the at least one fin of the fins.

17. The method of claim 16, wherein the dummy fin also comprises a fin having the first dielectric layer but not to be used.

18. The method of claim 1, wherein the predetermined mandrel is located at an area adapting for the separately isolated device.

* * * * *